United States Patent [19]
Nishida et al.

[11] Patent Number: 5,960,562
[45] Date of Patent: *Oct. 5, 1999

[54] PROCESSING APPARATUS OF PROCESSING WAFER SHEETS

[75] Inventors: Tatsuya Nishida, Kurume; Kenji Miyachi, Fukuyama; Syujiro Oka, Kasaoka, all of Japan

[73] Assignee: Tokyo Electron, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/877,565

[22] Filed: Jun. 17, 1997

[30] Foreign Application Priority Data

Jun. 18, 1996 [JP] Japan ................................. 8-178415

[51] Int. Cl.⁶ .................................................. F26B 13/10
[52] U.S. Cl. .................................. 34/574; 34/58; 34/186
[58] Field of Search .............................. 34/560, 574, 58, 34/186, 312, 317, 318; 134/902

[56] References Cited

U.S. PATENT DOCUMENTS 5,469,634  11/1995  Mezaki ........................................ 34/58
5,667,535   9/1997  Kasahara .................................. 34/58 X
5,692,313  12/1997  Ikeda et al. .................................. 34/58

FOREIGN PATENT DOCUMENTS 2517672   9/1996  Japan .
2575077  10/1996  Japan .

*Primary Examiner*—Henry A. Bennett
*Assistant Examiner*—Steve Gravini
*Attorney, Agent, or Firm*—Smith, Gambrell & Russell, LLP

[57] ABSTRACT

A processing apparatus of the invention includes a rotary processing part for rotating and drying plural sheets of objects to be processed collectively in order to allow the object to be rotated immediately after they are accommodated in the rotary processing part and a balance adjusting mechanism for adjusting balance of the rotary processing part by moving counterweights in accordance with the number of the objects. Further the processing apparatus further includes a counter for counting the number of the objects accommodated in the rotary processing part and a control unit for controlling the balance adjusting operation of the balance adjusting mechanism in accordance with a predetermined relationship between the number of objects and the respective positions of the counterweights.

7 Claims, 12 Drawing Sheets

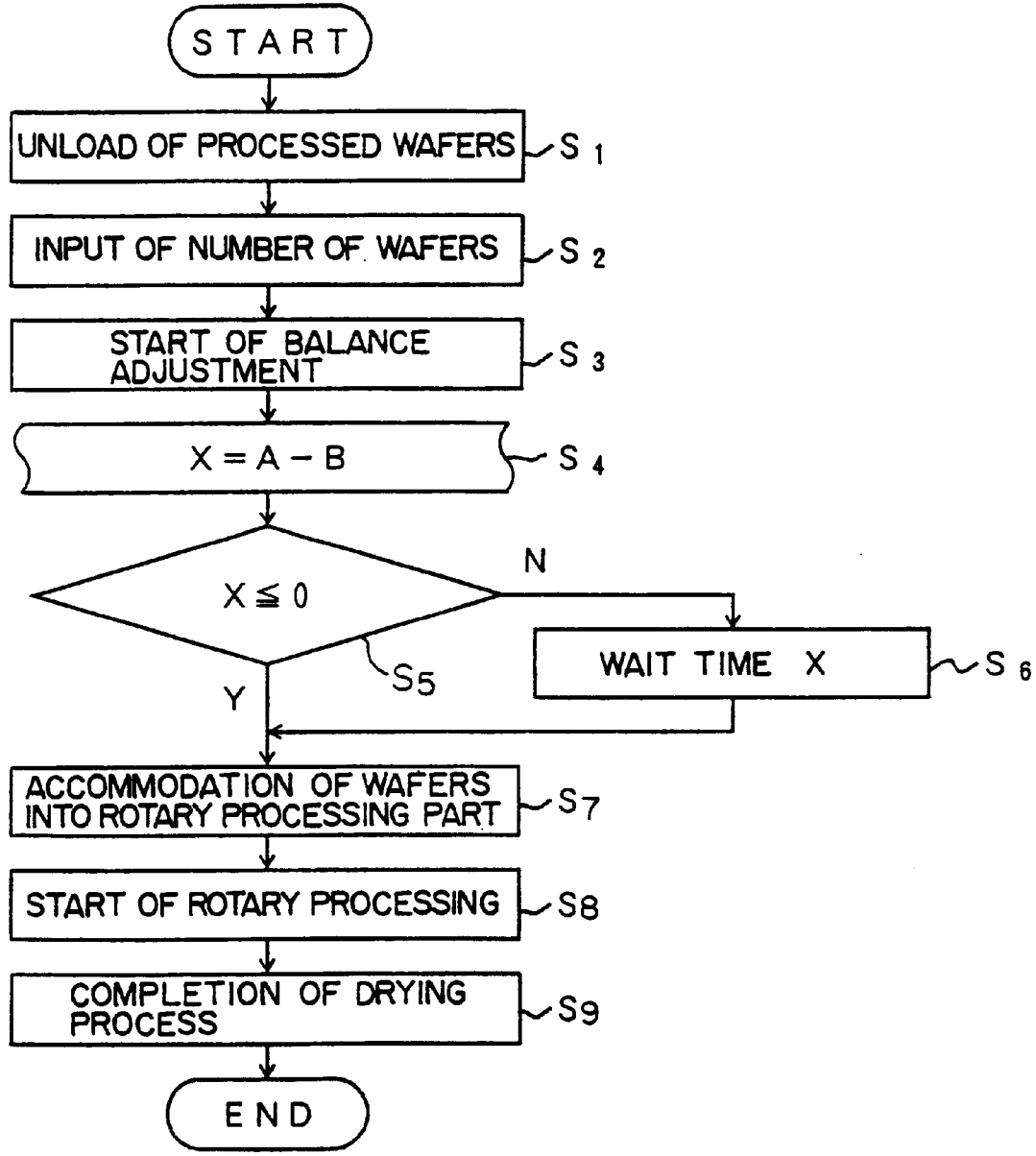
F I G. 13

01;1

PROCESSING APPARATUS OF PROCESSING WAFER SHEETS

BACKGROUND OF THE INVENTION

The present invention relates to a processing apparatus for and a processing method of executing a treatment including a process in which an object to be processed, such as a semiconductor wafer, is rotated so as to scatter liquid sticking on a surface of the object by centrifugal force due to its rotation.

For example, in the manufacturing process for a semiconductor device, various cleaning systems are employed for removing contamination, such as particles and organic contaminants, on the surface of the semiconductor wafer. Note, the semiconductor wafer will be referred as "the wafer", hereinafter. Above all, a cleaning system of the wet type where the wafer can be cleaned by dipping it into cleaning liquid in a processor has merit to remove the particles on the wafer effectively.

In order to permit a continuous batch process, the wet type cleaning system comprises a loader for loading, for example, twenty five wafers into the processing apparatus with every carrier, transporting means for transporting fifty wafers corresponding to two carriers loaded by the loader collectively, a processing unit arranged for cleaning and drying the wafers, which have been transported by the transporting means, in batch processing, and an unloader for unloading the wafers cleaned and dried. With these elements, this cleaning system is called "a wet station" in widespread use.

At respective processing sections constituting the wet station, a variety of chemical treatments, such as ammonia treatment, hydrogen fluoride treatment, sulfuric acid treatment, hydrochloric acid treatment etc., and a washing treatment with pure water are carried out by turns.

Further, a drying treatment is executed finally.

As the processing section for drying the wafers, there are well-known a rotary processing part in which the wafers are dried by shaking treatment-liquid off wafer surfaces due to the action of centrifugal force caused by rotating the wafers, and a IPA processing part in which the wafers are dried by draining while supplying water-amiable IPA [isopropyl alcohol:(CH$_3$)$_2$CHOH] steam to the wafer surfaces, conventionally. The rotary processing part which is also called "spin dryer" has the advantage of simple structure and low running costs because of disuse of an explosion-proof mechanism, in comparison with those of the IPA processing part. In the prior art, a spin dryer disclosed in e.g. Japanese Utility Model Publication (kokai) No. 5-83870 is well-known as the rotary processing (drying) part.

We now describe a structure of the conventional rotary drying part in brief. As shown in FIG. 1, a processing chamber 200 arranged in the rotary processing part includes a pair of rotating shafts 201, 202 arranged in series. The rotating shaft 201 is one to which rotating force of a motor 203 is transmitted, while the other shaft 202 is a driven shaft. To the rotating shafts 201, 202, rotors 205, 206 in processing chamber 200 are attached respectively. A plurality of wafers W are collectively carried in their juxtaposed condition by constraint mechanisms 207, 208 bridging between the rotor 205 and the rotor 206. As shown in FIG. 2, the constraint mechanisms 207, 208 are provided, on surfaces thereof abutting on the wafers W, with numerous grooves 210 which are formed at constant intervals. In use, by inserting the peripheries of the wafers W into the groove 210, it is possible to carry the plural wafers W between the constraint mechanisms 207, 208 while keeping the wafers W to be juxtaposed apart from each other at regular intervals.

Further, against the processing chamber 200, not-shown intake port and exhaust port are connected for flowing air in the chamber 200. Since the wafers W are rotated while ventilating the chamber 200 through the intake and exhaust ports, it is possible to scatter moisture sticking on the wafers W by centrifugal force and also to dry the wafers W per se by the flowing of fresh air.

In such a rotary processing part, however, there is a case that the center of gravity of the wafers W and the center of rotation (of the rotating shafts 201, 202) do not overlap with each other. If the wafers W are rotated while leaving such a condition, vibrations may be caused during its rotation because of the ill-balanced rotary processing part. Therefore, from the points of view of the prevention of noise and the improvement in durability of the apparatus, it is necessary to adjust the balance of the rotary processing part so as not to increase vibrations caused by the rotation of the wafers W, thereby suppressing centrifugal whirling of the shafts. For this purpose, in the above processing part, two autobalancers 211, 212 are mounted on the rotating shafts 201, 202 rotating together with the wafers W respectively, for their integral rotation. In detail, the adjustment of balance is executed by moving counterweights accommodated in the autobalancers 211, 212 to appropriate positions.

It should be noted that the autobalancers 211, 212 have similar structures to each other. Therefore, we now describe the structure of autobalancer 211 mounted on the shaft 201 representatively. As shown in FIGS. 3A and 3B, the autobalancer 211 is provided with a pair of inside counterweights 213, 214. Since the counterweights 213, 214 rotate together with the shaft 201, centrifugal forces 215, 216 are applied on the counterweights 213, 214, respectively. In arrangement, the counterweights 213, 214 can be angularly moved freely within 360 degrees. In this regard, FIG. 3A shows a condition that the counterweight 213 is diametrically opposite to the counterweight 214 (at 180 degrees). In this case, a direction of centrifugal force 215 applied on the counterweight 213 is opposite to that of centrifugal force 216 applied on the counterweight 214, a resultant force of the centrifugal forces 215, 216 amounts to zero by their mutual negation.

While, FIG. 3B shows a condition that the counterweights 213, 214 are angularly moved from the positions of FIG. 3A by predetermined angles. In this case, the autobalancer 211 during rotation is subjected to a resultant force 217 consisting of the centrifugal force 215 applied on the counterweight 213 and the centrifugal force 216 applied on the counterweight 214. In this way, by optionally changing the positions of the counterweights 213, 214 in the autobalancers 211, 212, it is possible to change both direction and magnitude of the resultant force 217 consisting of the centrifugal force 215 applied on the counterweight 213 and the centrifugal force 216 applied on the counterweight 214. Thus, with the optional establishment in direction and magnitude of the resultant force 217, the balance of the wafers W rotating in the processing chamber 200 is adjusted in the conventional processing part. Note, as mentioned above, the autobalancer 212 has a structure similar to that of the autobalancer 211.

Now, as a method of seeking the most suitable positions of the counterweights 213, 214 in the autobalancer 211, 212 for adjusting the balance, the following method has been generally adopted conventionally. That is, in order to examine a relationship between the positions of the counterweights 213, 214 and vibratory values, it is executed at least once to rotate the wafers W and measure their vibrations while successively changing the positions of counterweights 213, 214 by e.g. five degrees (5°) at a time on condition that the wafers W are accommodated in the processing chamber 200 of the rotary processing part previously. In this way, the most suitable positions of the counterweights 213, 214 to reduce the vibrations the most are determined on the basis of the obtained relationship.

However, it is impossible to seek the most suitable positions of the counterweights 213, 214 unless accommodating the wafers W in the processing chamber 200 and rotating them practically. Consequently, at least one superfluous rotating operation must be carried out before starting the rotation of the wafers W for dry, which is far from the shortening of processing period. Furthermore, according to the method, since the rotating operation of the wafers W has to be carried out despite that the balance is not adjusted yet, there is a problem that remarkable vibrations are produced during the rotating operation.

Recently, it has been found that the number of wafers W accommodated in the processing chamber 200 of the rotary processing part is closely related with the respective positions of the counterweights 213, 214. That is, to take an instance of the rotary processing part which is so constructed as to rotate the processing chamber 200 allowing e.g. a maximum of fifty sheets of wafers W to be accommodated collectively, there is a fact that when fifty wafers W are accommodated in the chamber 200, an operator has only to move the counterweights 213, 214 to prescribed angular positions. Similarly, the operator has only to move the counterweights 213, 214 to another prescribed angular positions in case of forty nine wafers W, while the operator has only to move the counterweights 213, 214 to the other prescribed angular positions in case of forty eight wafers W. That is, it has been found that, if the number of wafers W can be found out, the most suitable positions of the counterweights 213, 214 allowing their movement to be reduced to the maximum can be determined automatically. In this way, if only examining the relationship between the number of the wafers W and the positions of the counterweights 213, 214 previously, the operator has only to count the number of wafers W and sequent adjust the positions of the counterweights 213, 214 in accordance with such preset data, practically. Therefore, in such a case, there is no need for the operator to repeat the superfluous rotating operations every process.

Under such a circumstance, in the spin dryer disclosed in the above publication No. 5-83870, a counter consisting of a pair of light emitter and light receiver is provided in the rotary processing part for counting the number of wafers W accommodated therein and the adjustment for balance is carried out on the basis of the obtained discrete value. According to the method, the operator does not have to carry out the superfluous rotating operation before rotating the wafers for drying.

However, since the above spin dryer is adapted so as to begin to count the wafers for the balance adjustment after they have been accommodated in the rotary processing part, it is impossible to start to rotate the wafers as soon as they have been accommodated in the rotary processing part. For example, in the above-mentioned "wet" type of cleaning system, the wet wafers on which water is sticking due to the previous cleaning and sequent rinsing steps are to be accommodated in the rotary processing part. Accordingly, if such wet wafers are left as they are for a long time, the water will evaporate naturally, so that so-called "water marks" will appear on the surfaces of the wafers disadvantageously.

In addition, since the spin dryer in the above publication No. 5-83870 has the counter arranged in the rotary processing part, the water scattering by the rotation of the wafers may stick on the light emitter and the light receiver to cause their malfunctions. Furthermore, since it takes a long time from the dryer's accommodating the wafers in the rotary processing part till the starting, it is difficult to shorten the processing period. Additionally, since the rotary processing part of the spin dryer is not so wide in general, there are some cases of difficulty to arrange the counter in the rotary processing part.

SUMMARY OF THE INVENTION

Accordingly, it are therefore an object of the present invention to provide means which is capable of starting to rotate objects to be processed as soon as they have been accommodated in a rotary processing part.

The object of the present invention described above can be accomplished by a processing apparatus comprising:

a rotary processing part for rotating and drying plural sheets of objects to be processed collectively;

a balance adjusting mechanism having a counterweight, for adjusting the balance of the rotary processing part by moving the counterweights in accordance with the number of the objects;

counting means for counting the number of the objects accommodated in the rotary processing part; and control means for controlling the balance adjusting operation by the balance adjusting mechanism in accordance with a predetermined relationship between the number of the objects and respective positions of the counterweights.

The object of the present invention described above can be also accomplished by a processing apparatus:

one or more processing parts for processing plural sheets of objects to be processed;

a rotary processing part for collectively rotating and drying the objects processed by the processing parts;

a balance adjusting mechanism having a counterweights, for adjusting the balance of the rotary processing part by moving the counterweights in accordance with the number of the objects;

counting means for counting the number of the objects before the objects are processed by the processing parts; and control means for controlling the balance adjusting operation by the balance adjusting mechanism in accordance with a predetermined relationship between the number of the objects and respective positions of the counterweights.

In the above-mentioned processing apparatuses, preferably, the control means controls the balance adjusting mechanism in a manner that the balance adjusting operation of the balance adjusting mechanism has been finished until the objects are accommodated in the rotary processing part at the latest.

Providing that a period from a beginning of the balance adjusting operation to the end is represented by a letter A while a period from a beginning of transferring said object from a former processing part just before said rotary processing part to said rotary processing part to the end of transferring after which said objects are able to be rotary-processed is represented by a letter B, more preferably the control means is constructed so that, in case of $A \leq B$, the transferring of the objects into the rotary processing part is started as soon as the balance adjusting operation has been started, while in case of A>B, the objects wait for at least a time A−B since the balance adjusting operation was started, at the former processing part just before said rotary processing part, then the transferring of the objects into the rotary processing part is started.

Alternatively, it is also preferable that the predetermined relationship between the number of the objects and the position of the counterweight is introduced from a predetermined relationship between the number of the objects and resultant force of the counterweights and wherein, providing that the number of the objects is represented by a variable x while the resultant force is represented by a variable y, certain constant values are represented by constants a and b the predetermined relationship between the number of the objects and the resultant force is expressed by an equation as below.

$$y = a\ x + b$$

According to the invention there is also provided a method of processing plural sheets of objects to be processed, on condition of making use of a processing apparatus comprising a rotary processing part for rotating and drying the objects collectively and a balance adjusting mechanism having a plurality of counterweights for balancing the rotary processing part, the method comprising steps of:

adjusting balance of the rotary processing part by moving the counterweights in accordance with the number of the objects accommodated in the rotary processing part; and thereafter, rotating the object collectively in order to process them;

wherein the balance adjusting step has been finished at the latest until the objects are accommodated in the rotary processing part and are able to be rotary-processed; and the rotating step is started as soon as the objects have been accommodated in the rotary processing part.

In the present method, preferably, the balance adjusting step is carried out after the drying of the objects at the rotary processing part has been finished in the previous routine and before the objects are accommodated in the rotary processing part and are able to be rotary-processed in the present routine.

Alternatively, providing that a period from a beginning of the balance adjusting operation to the end is represented by a letter A while a period from a beginning of transferring said object from a former processing part just before said rotary processing part to said rotary processing part to the end of transferring after which said objects are able to be rotary-processed is represented by a letter B, more preferably case of A≦B, to transfer the objects into the rotary processing part is started as soon as the balance adjusting step has been started, while in case of A>B, the objects wait for at least a time A−B since the balance adjusting operation was started, at the former processing part just before said rotary processing part, then to transfer the objects into the rotary processing part is started.

Alternatively, it is also preferable that the balance adjusting step to move the counterweights in accordance with the number of the objects accommodated in the rotary processing part is carried out in accordance with a predetermined relationship between the number of the objects and resultant force of the counterweights and wherein, providing that the number of the objects is represented by a variable x while the resultant force is represented by a variable y, certain constant values are represented by constants a and b the predetermined relationship between the number of the objects and the resultant force is expressed by an equation as below.

$$y = a\ x + b$$

More preferably, the predetermined relationship between the number of the objects and the resultant force is obtained by executing both of the rotating step for rotating the objects accommodated in the rotary processing part and the balance adjusting step for balancing the rotary processing part, with respect to a variety of different numbers of the objects.

More preferably, the different numbers of the objects contain all the numbers of the objects.

Alternatively, the different numbers of the objects contain numbers of the objects picked up at intervals of a definite number of the objects.

In the present method, preferably, the number of the objects is counted before a process carried out previous to the rotating step.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 13 is a flow chart showing steps of adjusting balance in accordance with the embodiment of the invention.

DESCRIPTION OF THE PREFERRED EMBODIMENT

Figure 1:
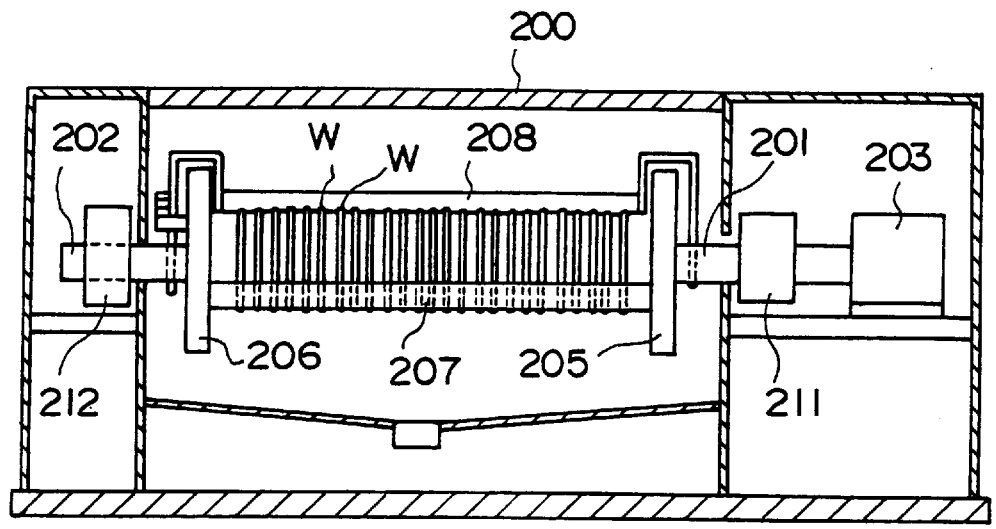
FIG. 1 is an inside structural view of a rotary processor of a conventional processing apparatus.
Figure 2:
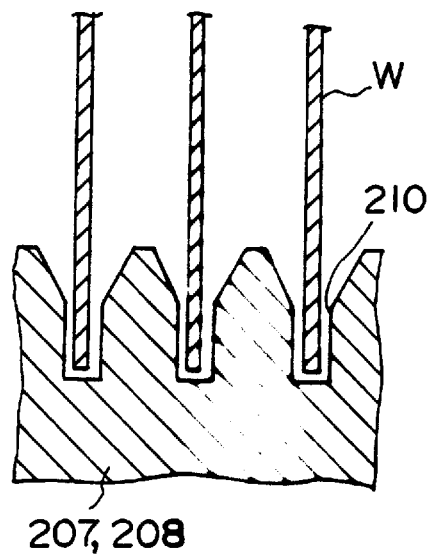
FIG. 2 is an enlarged cross sectional view showing a condition that margins of the wafers are inserted into grooves of a retainer lever.

Referring to the drawings, preferred embodiments of the present invention will be described on the basis of a cleaning system 1 for cleaning wafers W as one example of the objects to be processed.

Figure 4:
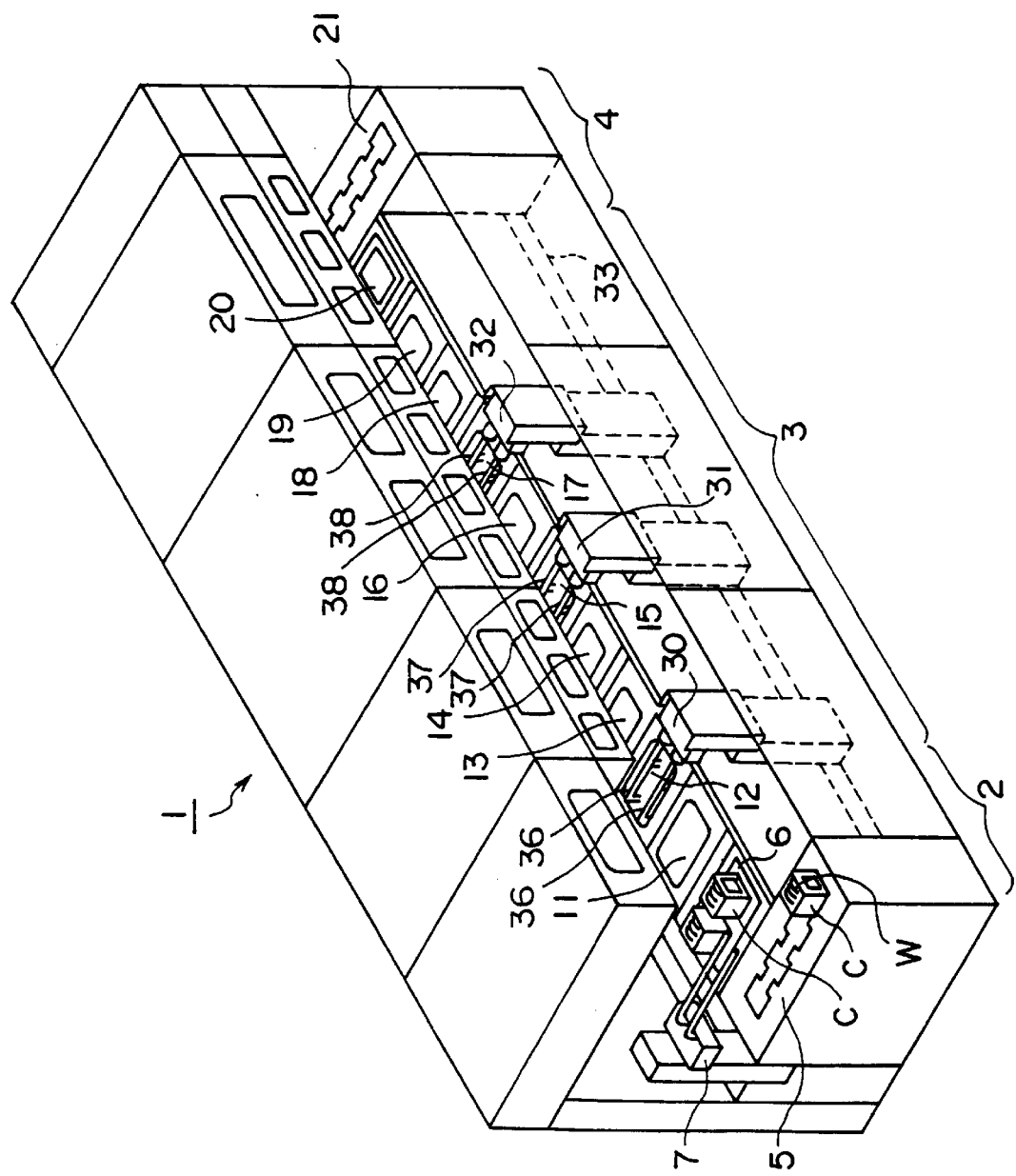
FIG. 4 is a perspective view of a cleaning system in accordance with the present invention.

FIG. 4 is a perspective view of the cleaning system 1.

Being classified roughly, the cleaning system 1 comprises a loading/pickup section 2 for picking up the wafers W before cleaning, which have been brought in blocks of a carrier C, from the carrier C in their oriented manner, a cleaning/drying section 3 for cleaning and sequent drying the plural wafers W (e.g. two carriers, i.e. fifty sheets) picked up by the loading/pickup section 2, in a so-called "batch" manner collectively and a charging/unloading section 4 for charging the wafers W cleaned and dried in the section 3 into the carriers C in every predetermined number of wafer W (e.g. twenty-five sheets) and unloading the wafers W in blocks of the carrier C.

The loading/pickup section 2 includes a loading part 5 for loading and mounting the carrier C which is capable of accommodating the wafers W before cleaning (e.g. twenty-five sheets), a pick-up part 6 arranged adjacent to the part 5 for picking up the wafers W from the carrier C and positioning them in a low, and a transporting unit 7 for transporting a predetermined number of carriers C (e.g. two carriers) from the loading part 5 to the pick-up part 6 at a time.

According to the embodiment, in the cleaning/drying section 3, the following parts are arranged in order from the side of the loading/pickup section 2 to the side of the charging/unloading section 4: a processing part 11 for cleaning and drying a wafer chuck 36 of a conveying unit 30 described later, a processing part 12 for cleaning the wafer W by washing liquid, processing parts 13 and 14 for rinsing the wafer W cleaned at the part 12, a processing part 15 for cleaning the wafer W by washing liquid, processing parts 16 and 17 for rinsing the wafer W cleaned at the part 15, a processing part 18 for cleaning and drying a wafer chuck 38 of a conveying unit 32 also described later, and a rotary processing part 19 for rotating the wafer W cleaned at the parts 11 to 17 while circulating clean air thereby to scatter water sticking to the surface of the water W by centrifugal force and dry the wafer W by the clean air.

At the processing parts 11 and 18, the wafer chucks 38, 38 are cleaned by using pure water (example) and thereafter, they are dried. Further, at the processing parts 12 and 15, the wafer W is cleaned by different kinds of washing liquids from each other, generally. As an example, in the processing part 12, so-called "SC1" cleaning process using alkaline washing liquid, such as ammonium hydrogen peroxide ($NH_4OH/H_2O_2/H_2O$), is carried out to remove impurities on the surface of the wafer W, such as organic contaminants, particles or the like. While, in the processing part 15, so-called acid "SC2" cleaning process using e.g. hydrochloric acid and hydrogen peroxide ($HCl+H_2O_2$) is executed to remove metal ions and stabilize the surface of the wafer W. Further, in the processing parts 13 and 14, and the processing part 16 and 17, the rinsing of the wafer W is carried out by using washing liquid such as pure water. In the processing part 19, the wafer W is rotated in order to scatter the washing liquid sticking on the surface due to the centrifugal force and thereafter, the wafer W is subjected to the drying process where clean air circulates for removing water marks on the surface.

Note, the arrangement and combination of the respective processing parts 11 to 19 may be optionally modified in accordance with the sorts of cleaning of the wafer W. As the case may be, a certain processing part may be eliminated or conversely, another processing part may be added in the modification. For example, a processing part using sulferic acid and hydrogen peroxide ($H_2SO_4+H_2O_2$) may be incorporated. Note, it is general that the rotary processing part 19 for drying the wafer W is arranged at the latest.

The charging/unloading section 4 is provided with a charging part 20 having a constitution similar to that of the pick-up part 6 of the loading/pickup section 2, an unloading part 21 having a similar constitution similar to that of the loading part 5, and a not-shown transporting unit similar to the transporting unit 7.

The cleaning/drying section 3 is provided, on a front side thereof (i.e. the front side of FIG. 4), with three conveying unit 30, 31, 32 which are successively arranged from the side of the loading/pickup section 2 to the side of the charging/unloading section 4. The conveying units 30, 31, 32 are adapted so as to be slidable along a guide 33 in the longitudinal direction of the cleaning system 1. The respective conveying units 30, 31, 32 include wafer chucks 36, 37, 38, respectively. Owing to the wafer chucks 36, 37, 38, each of the conveying units 30, 31, 32 is capable of holding the prescribed number of wafers W (e.g. fifty wafers W corresponding to two carriers C) collectively. In these conveying units, since the unit 30 on the side of the loading/pickup section 2 slides along the guide 33 while retaining the prescribed number of wafers W by the wafer chuck 36, the wafers W picked up from the pick-up part 6 are collectively transported to the processing parts 12, 13, 14 in the cleaning/drying section 3, in order. Further, by the sliding movement of the center conveying unit 31 along the guide 33 while retaining the prescribed number of wafers W by means of the wafer chuck 37, the wafers W are collectively transported to the processing parts 14, 15, 16, 17 in the cleaning/drying section 3, in order. Since the unit 32 on the side of the charging/unloading section 4 slides along the guide 33 while retaining the prescribed number of wafers W by the wafer chuck 38, the processing unit 32 collectively transports the wafers W from the processing part 17 to the rotary processing part 19 and sequentially, from the part 19 to the unloading part 20 of the charging/unloading section 4.

Figure 5:
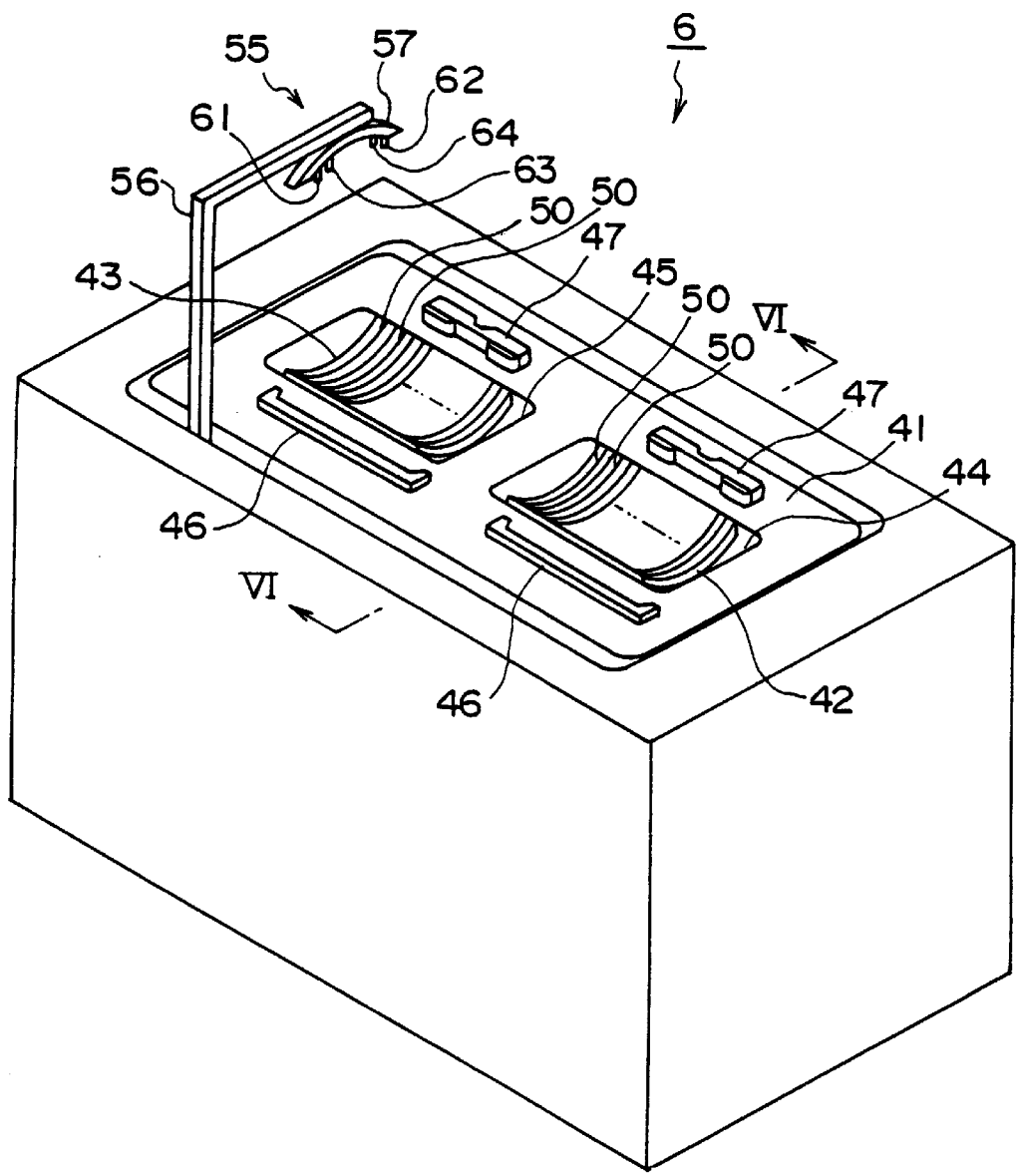
FIG. 5 is a perspective view of an unloader of the cleaning system.
Figure 6:
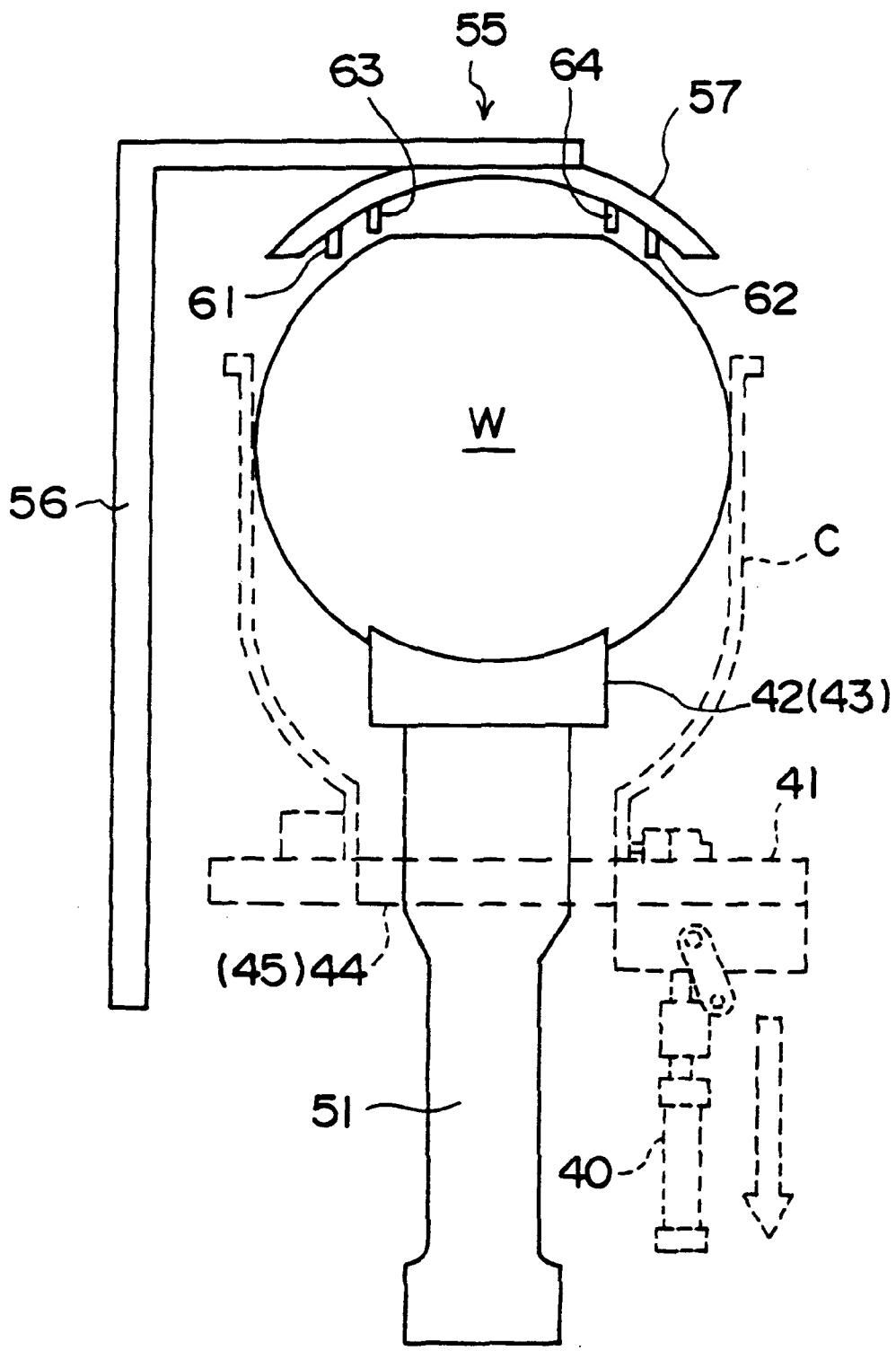
FIG. 6 is an enlarged cross sectional view taken along a line VI—VI of FIG. 5.

Hereat, referring to FIGS. 5 and 6, we now describe details of the pick-up part 6 constituting the loading/pickup section 2.

The pick-up part 6 is provided, on an upper surface thereof, with a movable stage 41 which drops (i.e. to move a direction of a dotted arrow of FIG. 6) by the shrinking operation of a cylinder 40. The movable stage 41 has openings 44, 45 formed to allow wafer carriages 42, 43 through. About each margin of the openings 44, 45, a guide member 46 and a pusher 47 are arranged to face each other, interposing each of the openings 44, 45 therebetween. Two carriers C, which have been transported from the above-mentioned loading part 5 to the pick-up part 6 by the transporting unit 6, are positioned by the guide members 46 and the pushers 47 and then fixed in prescribed positions on the movable stage 41, where not-shown openings formed in respective lower surfaces of the carriers C coincide with the openings 44, 45, respectively.

The wafer carriages 42, 43 are respectively provided, on upper surfaces thereof, with retainer grooves 50 (e.g. twenty five grooves) which are formed at predetermined intervals for receiving and retaining lower margins of the wafers W, respectively. Being fixed on respective upper ends of struts 51, the wafer carriages 42, 43 are arranged so as to always maintain on a same level with each other. Note, the strut 51 fixing the wafer carriage 42 on the front side is constructed so as to move close to the other carriage 43.

A wafer counter 55 is arranged above the pick-up part 6. The wafer counter 55 comprises a L-shaped guide member 56 which is movable along laterals of the wafer carriages 42, 43 and a curved member 57 carried by an upper end of the guide member 56. Arranged on an under surface of the curved member 57 are a pair of light emitter 61 and light receiver 62 both of which oppose level with each other and another pair of light emitter 63 and light receiver 64 both of which also oppose level with each other. The light emitter 63 and the light receiver 64 are arranged somewhat higher than the light emitter 61 and the light receiver 62, respectively.

The guide member 56 of the wafer counter 55 is normally arranged so as to retreat to the frontmost position of the pick-up part 6. As will be described later, when the wafers W are pushed up relative to the carrier C by the wafer carriages 42, 43, the guide member 56 moves along the laterals of the wafer carriages 42, 43. With this movement of the guide member 56, the light emitter 61 and the light receiver 62 opposing on the lower side of the curved member 57 are arranged so as to interpose the upper ends formed on the peripheries of the wafers W therebetween, as shown in FIG. 6. Consequently, when the light emitter 61 and the light receiver 62 pass through the respective upper end of the specified wafer W, the light emitted from the light emitter 61 is interrupted by the upper end of the wafer W, so that the light receiver 62 cannot receive the light. Owing to this event, the processing apparatus of the invention is capable of detecting the presence of the wafers W to count them. After counting the wafers W, the strut 51 fixing the front wafer carriage 42 is moved so that it approaches the innermost wafer carriage 43. Thus, the wafers W are gathered to one side in a row.

Note, as mentioned above, the light emitter 63 and the light receiver 64 opposing on the upper side of the curved member 57 are arranged somewhat higher than the light emitter 61 and the light receiver 62. In addition, the positions of the light emitter 63 and the light receiver 64 are established in such a manner that the light emitted from the light emitter 63 can pass somewhat above the upper ends of the wafers W and finally enter into the light receiver 64. Therefore, if the wafers W pushed up relative to the carriers C by the wafer carriages 42, 43 are not arranged in a row, for example, if a certain wafer W is not accepted in the retaining groove 50 of the wafer carriage 42, 43 to project upward, namely, in the "jumping slot" condition, the light from the light emitter 63 would be interrupted by the projecting wafer W, so that the light receiver 64 cannot receive the light. In this way, it is possible to detect whether the wafers W are arranged in a low or not and also detect a deviation of angle of the orientation flat.

Next, referring to FIGS. 7 to 10, we describe the constitution of the rotary processing part 19 installed in the cleaning/drying processing section 3 of the cleaning system 1 in detail.

Figure 7:
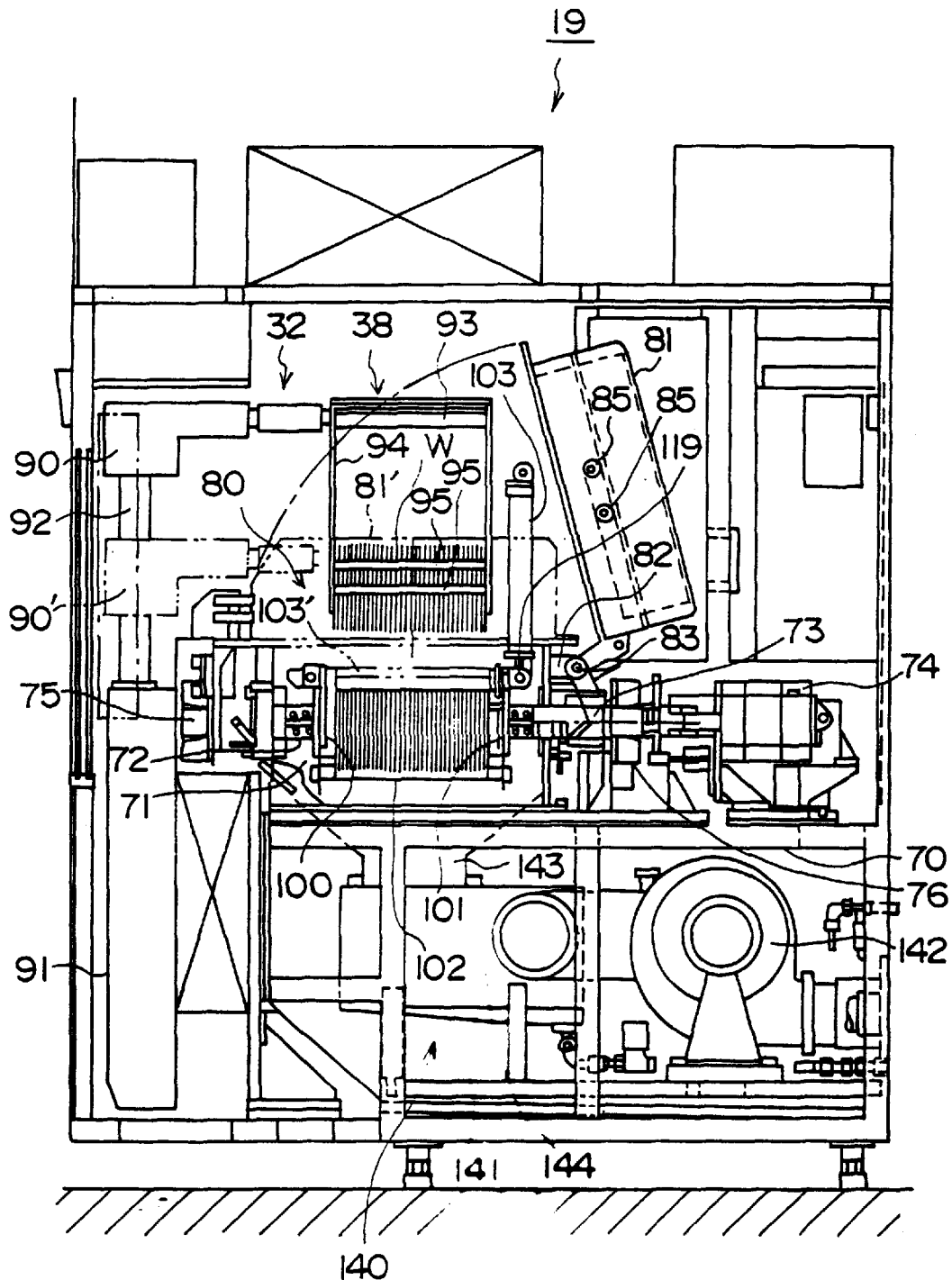
FIG. 7 is an explanatory view of an inside structure of a rotary processor in accordance with the embodiment of the present invention.
Figure 8:
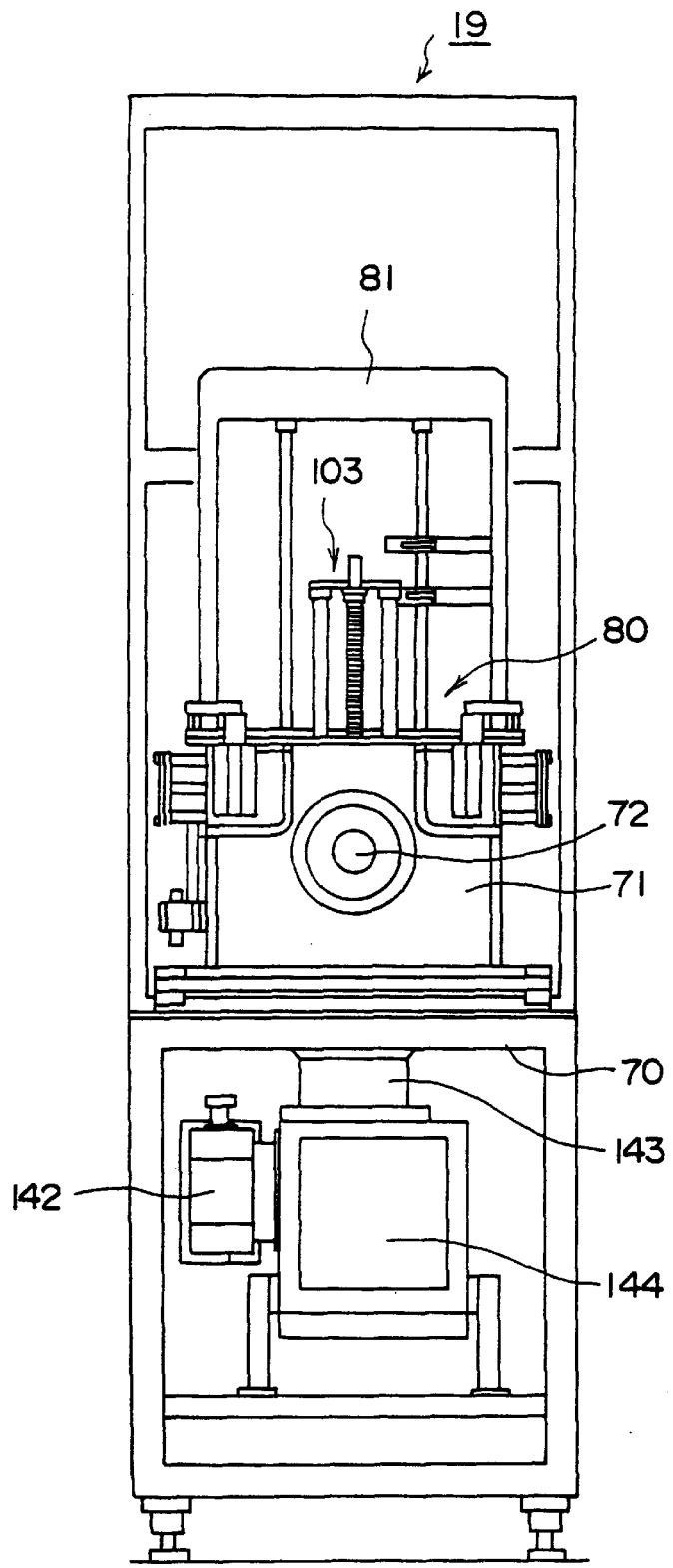
FIG. 8 is an explanatory front view of the inside structure of the rotary processor in accordance with the embodiment of the present invention.

As shown in FIG. 7, arranged in the rotary processing part 19 is a frame 70 on which a processing chamber 71 to rotating the wafers W for procession is supported. A pair of rotary shafts 72, 73 are arranged on both side surfaces of the processing chamber 71. The rotary shaft 72 corresponds to a driven spindle, while the rotary shaft 74 corresponds to a drive spindle rotated by a motor 74.

Figure 3A:
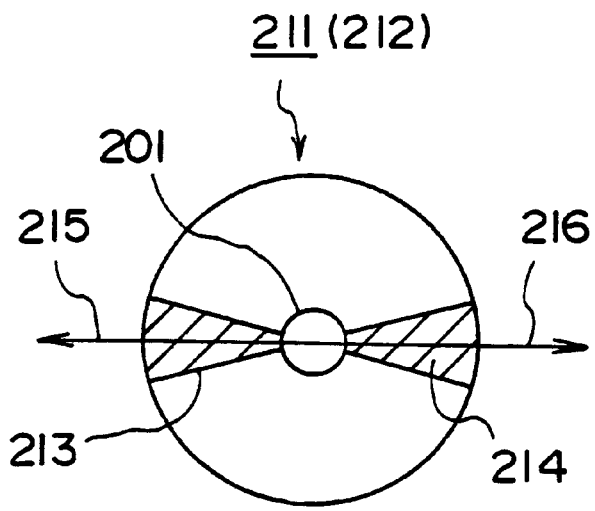
FIGS. 3A and 3B are explanatory views of an adjusting operation carried out by an auto balancing machine.
Figure 3B:
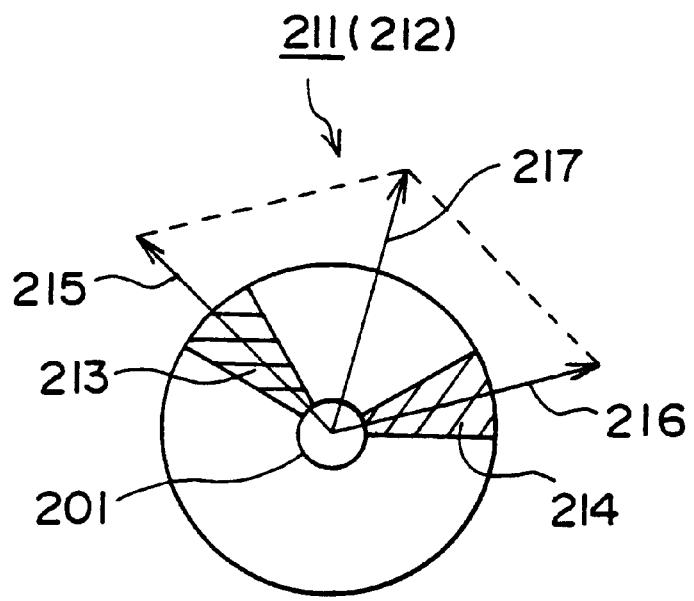

According to the embodiment, the rotary shafts 72, 73 are provided with automatic balancing devices (alias autobalancers) 75, 76, respectively. These autobalancers 75, 76 rotate together with the rotary shafts 72, 73 integrally. Similar to those in FIGS. 3A and 3B, each of the autobalancers 75, 76 includes two counterweights built-in for balancing the wafers W. In operation, by moving the counterweights, it is possible to balance the whole wafers W collectively accommodated in the processing chamber 71 of the rotary processing part 19.

The processing chamber 71 is formed to have an opening 80 on the upper side. A lid body 81 for closing the opening 80 is carried by an axle 83 penetrating a bracket 82 standing on the side surface of the processing chamber 71. When lifting up to rotate the lid body 81 about the axle 83 as a pivot, the upper part of the processing chamber 71 is opened. The lid body 81 shown with a solid line of FIG. 7 is in the lifted condition to open the upper side of the chamber 71. On the contrary, by lowering the lid body 81 about the axle 83, the chamber 71 can be closed. In FIG. 7, the lid body 81' shown with a two-dot chain line exhibits the condition to close up the chamber 71. On the side surface of the lid body 81, ionizers 85, 85 are attached for removing electric charge in the air supplied into the chamber 71, which will be described later.

Transferred above the processing chamber 71 are the wafers W (e.g. fifty wafers) which are held by the wafer chuck 38 of the above-mentioned conveying unit 32. The wafers W above the chamber 71 in this way are ones which has been already subjected to the prescribed processes in the processing parts 12 to 17.

This conveying unit 32 includes a driving part 90 for driving the wafer chuck 30. Above a traveling part 91 which travels in the longitudinal direction of the cleaning system 1, the driving part 90 is supported by an elevating part 92. In FIG. 7, the driving part 90 shown with a solid line designates the condition that it has been lifted up due to the rising of the elevating part 92. While, the driving part 90' shown with a two-dot chain line exhibits the condition that it has been lowered by the descent of the elevating part 92. The wafer chuck 38 has a pair of right and left grip members 93, 93 projecting from the driving part 90. Each grip member 93 is provided with two arms 94, 94 which are hung therefrom and between which upper and lower grip rods 95, 95 are attached to bridge a gap therebetween.

Figure 9:
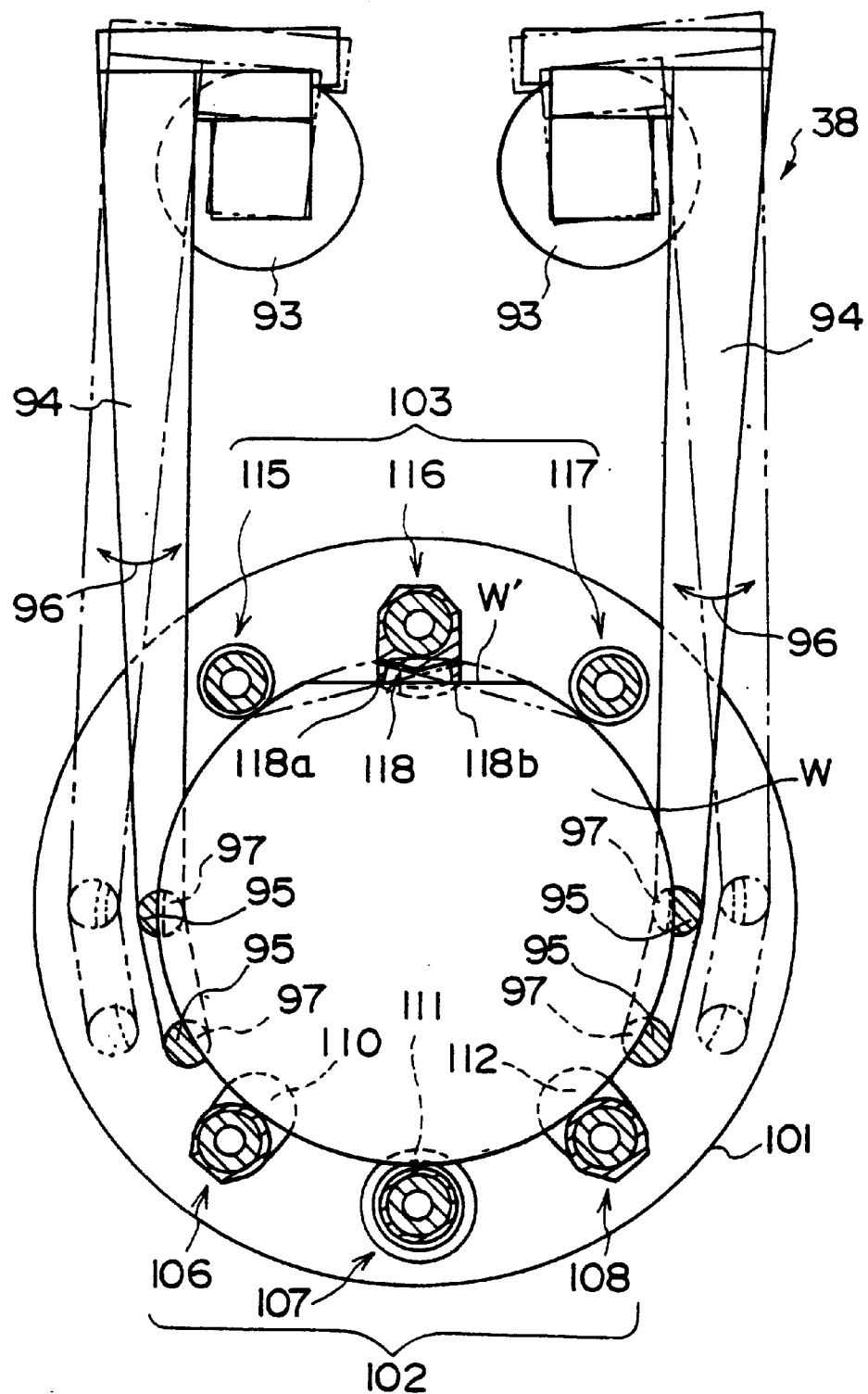
FIG. 9 is an enlarged front view of the wafer constrained by a lower constraining mechanism and an upper constraining mechanism.

FIG. 9 shows a front view of the wafer chuck 38. Owing to the rotation of the grip members 93, 93, the left and right arms 94, 94 can pivot in the directions of arrows 96, 96. The arms 94, 94 are adapted in a manner that when pivoted to approach each other, the arms 94, 94 can grasp the wafers (e.g. fifty wafers) W between the grip rods 95, 95 collectively. Each wafer W is shaped to have a substantially circular periphery and provided, at a part thereof, with an orientation flat part W'. In the cleaning system 1 of the embodiment, the wafers W are collectively grasped between the grip rods 95, 95 while the respective orientation flat parts W' point to the upward.

Further, the grip rods 95, 95 are provided, on respective insides thereof, with a plurality of grooves (e.g. fifty grooves) 97 which correspond to the wafers W, respectively, and which are formed at even intervals for retaining the peripheries of the wafers W. Therefore, when the arms 94, 94 of the wafer chuck 38 are pivoted to approach each other, the conveying unit 32 is capable of grasping the wafers W juxtaposed at even intervals collectively while, for example, fifty wafers W are inserted into the grooves 97 on the grip rods 95, 95. The conveying unit 32 is so constructed that, for example, fifty wafers W grasped between the grip members 95, 95 can be moved above the processing chamber 71, as shown in FIG. 7. Further, the descending operation of the elevating part 92 allows the wafers W, which are grasped by the grip members 95, 95 in a row, to descend while maintaining their postures directing their orientation flats W' to the upward, whereby the wafers W can be loaded into the processing chamber 71 through the opening 80.

As shown in FIG. 7, in the processing chamber 71, rotors 100, 101 are attached to the leading ends of the rotary shafts 72, 73. Between the rotor 100 and the rotor 101, a lower constraint mechanism 102 and an upper constraint mechanism 103 are installed in the chamber 71. Since the rotors 100, 101 are connected with each other through the intermediary of the constraint mechanisms 102, 103, the rotating operation of the motor 74 allows the rotors 100, 101 to be rotated together with the rotary shafts 72, 73 integrally.

As shown in FIG. 9, the lower constraint mechanism 102 comprises three pieces of double rod bodies 106, 107, 108 each of which can be obtained by press-fitting, for example, a stainless pipe into a Teflon (trademark) pipe and which are secured on the rotors 100, 101, respectively. The rod bodies 106, 107, 108 are provided, on their surfaces abutting on the wafers W (i.e. upper surfaces in the figure), with respective grooves 110, 111, 112 which correspond to the grooves 97 formed on the inside of the grip members 95 95. As mentioned above, when the wafers W (e.g. fifty wafers) grasped between the grip members 95, 95 of the wafer chuck 38 are loaded in the processing chamber 71 due to the descent movement of the elevating part 92 of the conveying unit 32, the peripheries of the wafers W are inserted into the grooves 110, 11, 112. Under such a condition, the grooves 110, 112 of the pipe bodies 106, 108 serve to bear up the wafers' own weights, while the grooves 111 of the rod body 107 serve to prevent the wafers W from tilting. Consequently, the wafers W can be held so as to stand in a line at regular intervals while keeping their postures to stand upright on the rod bodies 106, 107, 108.

Similarly, the upper constraint mechanism 103 includes three pieces of double rod bodies 115, 116, 117 which can be obtained by press-fitting, for example, stainless pipes into Teflon (trademark) pipes, respectively, as shown in FIG. 9. Note, the rod bodies 115, 117 on both sides are formed to be circular rods with no grooves. The rod body 116 is provided, on the surface abutting on the wafers W (i.e. lower surface in the figure), with grooves 118 which respectively correspond to the grooves 110, 111, 112 formed on the lower rod bodies 106, 107, 108 of the aforementioned lower constraint mechanism 102. Having two slanted surfaces 118a, 118b, the groove 110 is formed to have a substantially V-shaped configuration.

Figure 10:
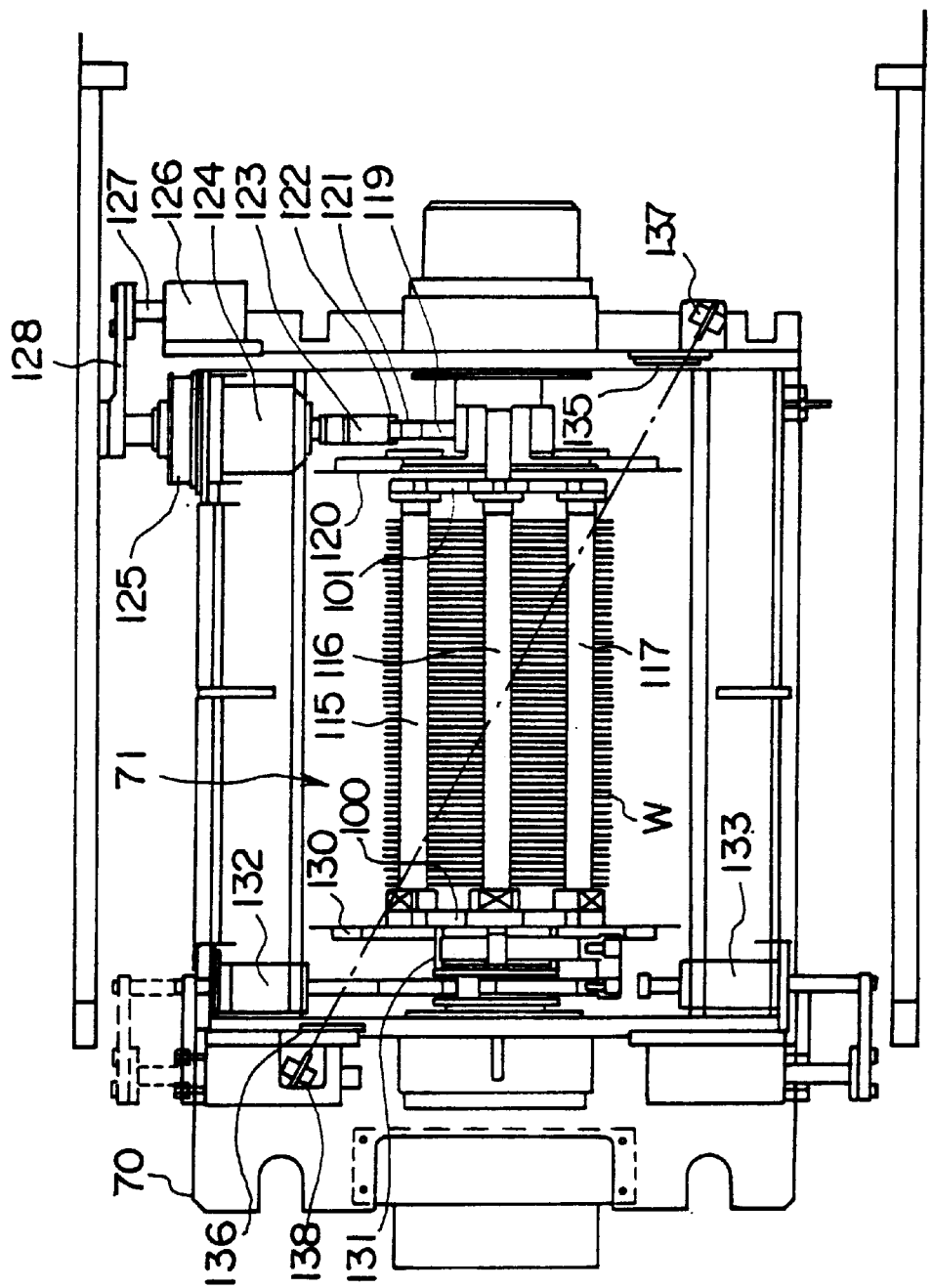
FIG. 10 is a plan view of a processing chamber.

As shown in FIG. 10, the constraint mechanism 103 includes a T-shaped bracket 120 which is arranged on the side of respective base ends of the rod bodies 115, 116, 117 and a T-shaped bracket 130 which is arranged on the side of respective leading ends of the rod bodies 115, 116, 117. The bracket 120 on the side of the base ends is attached to a shaft 119 rotatably supported by the rotor 101. Therefore, by rotating the whole constraint mechanism 103 on the upper side about the shaft 119, it is possible to selectively realize a state where the mechanism 103 is rotated by an angle of 90 degrees to escape upward of the processing chamber 71 as shown with a solid line of FIG. 7 and another state where the mechanism 103 is inclined horizontally thereby to hold the wafers W accommodated in the processing chamber 71, between the mechanism 103 and the lower constraint mechanism 102 as shown with a chain line 103' of FIG. 7.

As will be described later, under condition that, for example, fifty wafers W collectively delivered from the wafer chuck 38 are held by the upper and lower constraint mechanisms 102, 103, the peripheries of the wafers W are inserted into the grooves 110, 111, 112 of the rod bodies 106, 107, 108 of the lower constraint mechanism 102 and the grooves 118 of the rod body 106 of the upper constraint mechanism 103, so that the wafers W are held in parallel at even intervals. Further, the rotation of the wafers W, which are restrained by the lower and upper constraint mechanisms 102, 103, with respect to rotors 100, 101 are prevented due to the abutment of the orientation flats W' with either of the slanted surfaces 118a, 118b.

As shown in FIG. 10, the shaft 119 rotatably carried by the rotor 101 is provided, on one end thereof, with a meshing part 121. Mounted on the wall of the processing chamber 71 is a bearing unit 124 which carries a shaft 123 so as to rotate and reciprocate thereon. The shaft 123 is provided with a meshing part 122 which can mesh with the meshing part 121 of the shaft 119. At the exterior of the processing chamber 71, the shaft 123 has a timing pulley 125 attached thereto. Through the timing pulley 125, rotationally driving force of not-shown motor is transmitted to the shaft 123. The rear end of the shaft 123 is connected with a piston rod 127 of a cylinder 126 fixed on the exterior of the processing chamber 71 through a member 128. With the arrangement, the shaft 123 can go ahead and back in accordance with expansion and contraction of the piston rod 127 due to the operation of the cylinder 126.

While, the bracket 130 on the side of the leading end can maintain its locked condition that it is fixed by a switching pin 131 attached to the rotor 100 and the unlocked condition that it is not fixed. On the wall of the chamber 71, a pusher 132 for bringing the switching pin 131 into the locked condition and another pusher 133 for bringing the switching pin 131 into the unlocked condition are arranged to oppose to each other in series with the pin 131.

Further, the processing chamber 71 is provided, on the opposite walls, with windows 135, 136 which allow the light through. The chamber 71 further includes a floodlight 137 attached on the wall to emit the light into the interior of the processing chamber 71 and a light-receiving sensor 138 also attached to the wall for receiving the emitted light. When the wafers W are accommodated in the processing chamber 71, the light is interrupted by the wafers W, so that the light-receiving sensor 138 cannot detect the light. Thus, owing to this phenomenon, it is possible to detect the presence of the wafers W.

In FIG. 7, arranged beneath the processing chamber 71 is a gas-liquid removing mechanism 140 which is constructed in the frame 70. The gas-liquid removing mechanism 140 is provided in order to suck the interior of the chamber 71 and remove moisture or water separated from the wafers W in the chamber 71. The mechanism 140 consists of a drain 141 and a blower 142 both of which are communicated with the processing chamber 71 through connection ducts 143, 144, respectively.

We now describe the processing of the wafers W in the above-constructed cleaning system 1.

First, by appropriate transporting means, such as a not-shown transporting robot, the carrier C is mounted on the loading part 5 in the loading/pick-up section 2. In the state, the wafers W on the carrier C are not cleaned yet. Although the carrier C has a prescribed number (e.g. twenty five) of wafers W loaded thereon in a normal case, there may be a case of unloading the wafers W less than the prescribed number, for some reason or other.

After aligning the orientation flats W' of the wafers W, the carriers C mounted on the loading part 5 in the loading/pick-up section 2 are successively conveyed to the adjacent pick-up part 6 by the conveying unit 7. At each time of the operation, each carrier C is positioned by the guide members 46 and the pusher 47. In this way, when two carriers C are positioned in a manner that the respective lower openings are right above the openings 44, 45 formed on the movable stage 41 respectively, it begins to descend together with the carriers C. At this time, since the wafer carriages 42, 43 are fixed on the upper ends of the struts 51 to maintain the same levels, the wafers W loaded in the carriers C are pushed up by the wafer carriages 42, 43, so that the wafers W are picked up from the carriers C and maintained in the grooves 50 of the carriages 42, 43.

Next, the guide member 56 of the wafer counter 55 moves along the wafer carriages 42, 43 while scanning the upper ends of the wafers W between the light emitter 61 and the light receiver 62 to count the number of wafers W. Simultaneously, by the light emitter 63 and the light receiver 64, it is carried out to confirm whether or not all wafers W are carried in a row. The number of wafers W obtained in this way is then inputted and memorized in a central control unit 150 which will be described later with reference to FIG. 11.

After completing to count the wafers W, the strut 51 fixed to the wafer carriage 42 on the front side of FIG. 5 is moved to approach it to the wafer carriage 43 on the interior side. Consequently, the wafers W are gathered to one side of the pick-up part 6, whereby the wafers W corresponding to two carriers C are arranged in a row at even intervals. In this way, the wafers W corresponds to two carriers C are brought into their "orderly stand-by" condition in the pick-up part 6 of the loading/pick-up section 2.

Keeping the arrangement in a row, the wafers W orderly arranged on the wafer carriages 42, 43 are then collectively grasped by the wafer chuck 36 of the conveying unit 30, which has been already cleaned and dried in the processing part 11 of the cleaning/drying processing section 3, and transported into the processing parts 12, 13, 14 where the wafers W are dipped into the cleaning liquid for the successive cleaning process. Thereafter, the wafers W are collectively grasped by the wafer chuck 37 of the conveying unit 31 and conveyed to the processing parts 15, 16, 17 where the wafers W are also dipped into the cleaning liquid for the successive cleaning process.

The wafers W after the prescribed cleaning processes in the processing parts 12 to 17 are then collectively grasped by the wafer chuck 38 of the conveying unit 32 while maintaining their orderly arrangement and conveyed to the upside of the processing chamber 71 of the rotary processing part 19, as shown in FIG. 7.

In this situation, in the processing chamber 71, the lid body 81 is rotated upwardly and the opening 80 located at upper portion of the processing chamber 71 is opened as indicated by solid line in FIG. 7, while the constraint mechanism 103 at the upper portion is rotated upwardly and retreated upwardly from the processing chamber 71, as indicated by solid line in the drawing.

Next, by a descent of the elevating part 92 of the conveying unit 32, the wafers W grasped by the wafer chuck 38 is introduced into the processing chamber 71 collectively. When the wafer chuck 38 falls up to a predetermined height, as shown in FIG. 9, the peripheries of the wafers W held between the grip members 95, 95 of the wafer chuck 38 are inserted into the grooves 110, 111, 112 formed on the rod bodies 106, 107, 108 of the lower constraint mechanism 102. After mounting the wafers W on the lower constraint mechanism 102, they are released from the grip members 95, 95 by the opening operation of the arms 94, 94 of the wafer chuck 38. Thereafter, by the rising of the elevating part 92, the wafer chuck 38 is elevated to retreat upwards of the processing chamber 71. Next, the wafers W delivered to the lower constraint mechanism 102 in the above way are supported by the grooves 110, 112 of the rod bodies 106, 108 and prevented from tilting by the grooves 111 of the rod body 107. Consequently, the wafers W are maintained to stand in parallel at even intervals while keeping their upright standing on three rod bodies 106, 107, 108.

After retreating the wafer chuck 38 from the chamber 71 while mounting them on the lower constraint mechanism 102, the upper constraint mechanism 103 is rotated downward about the shaft 119 with respect to the rotor 101 by ninety degrees (90°). Consequently, as shown in FIG. 7, the wafers W while standing upright are collectively restricted between the lower constraint mechanism 102 and the upper constraint mechanism 103' shown with the dashed line. Further, by the downward rotation of the lid body 81 about the axle 83, the upper part of the processing chamber 71 is closed by the lid body 81' shown with the two-dot chain line of FIG. 7.

Hereat, the above-mentioned downward rotation of the lower constraint mechanism 103 is accomplished by the operation of not-shown motor. Thus, after completing to deliver the wafers W to the lower constraint mechanism 102, the shaft 123 provided on the bearing unit 124 firstly advances toward the interior of the processing chamber 71, so that the meshing part 122 at the end of the shaft 123 meshes with the meshing part 121 at the end of the shaft 119 of the upper constraint mechanism 103. Next, the not-shown motor is activated for rotation. The rotation of the motor is transmitted into the shaft 123 through the timing pulley 125, so that the upper constraint mechanism 103 is rotated downward by ninety degrees (90°). After the restriction for the wafers W between the lower constraint mechanism 102 and the upper constraint mechanism 103 rotated in the above way, the pusher 132 arranged on the wall of the processing chamber 71 operates to urge the switching pin 131 attached to the rotor 100. Consequently, the bracket 130 on the leading end of the upper constraint mechanism 103 is fixed by the switching pin 131 into its locked condition. After the completion of process to restrict the wafers W between the constraint mechanisms 102, 103, the shaft 123 of the bearing unit 124 retreats, so that the meshing part 122 of the shaft 123 and the meshing part 121 of the shaft 119 are disengaged from each other. Correspondingly, the pusher 132 is contracted to depart from the switching pin 131 on the rotor 100. In this way, the process for accommodating the wafers W into the processing chamber 71 of the rotary processing part 19 is completed.

While, realized in accordance with the embodiment is a condition where the balance adjustment of the whole wafers W collectively held between the constraint mechanisms 102, 103 has been already finished by the autobalancers 75, 76 till the wafers W are accommodated in the processing chamber 71 at the latest.

Figure 11:
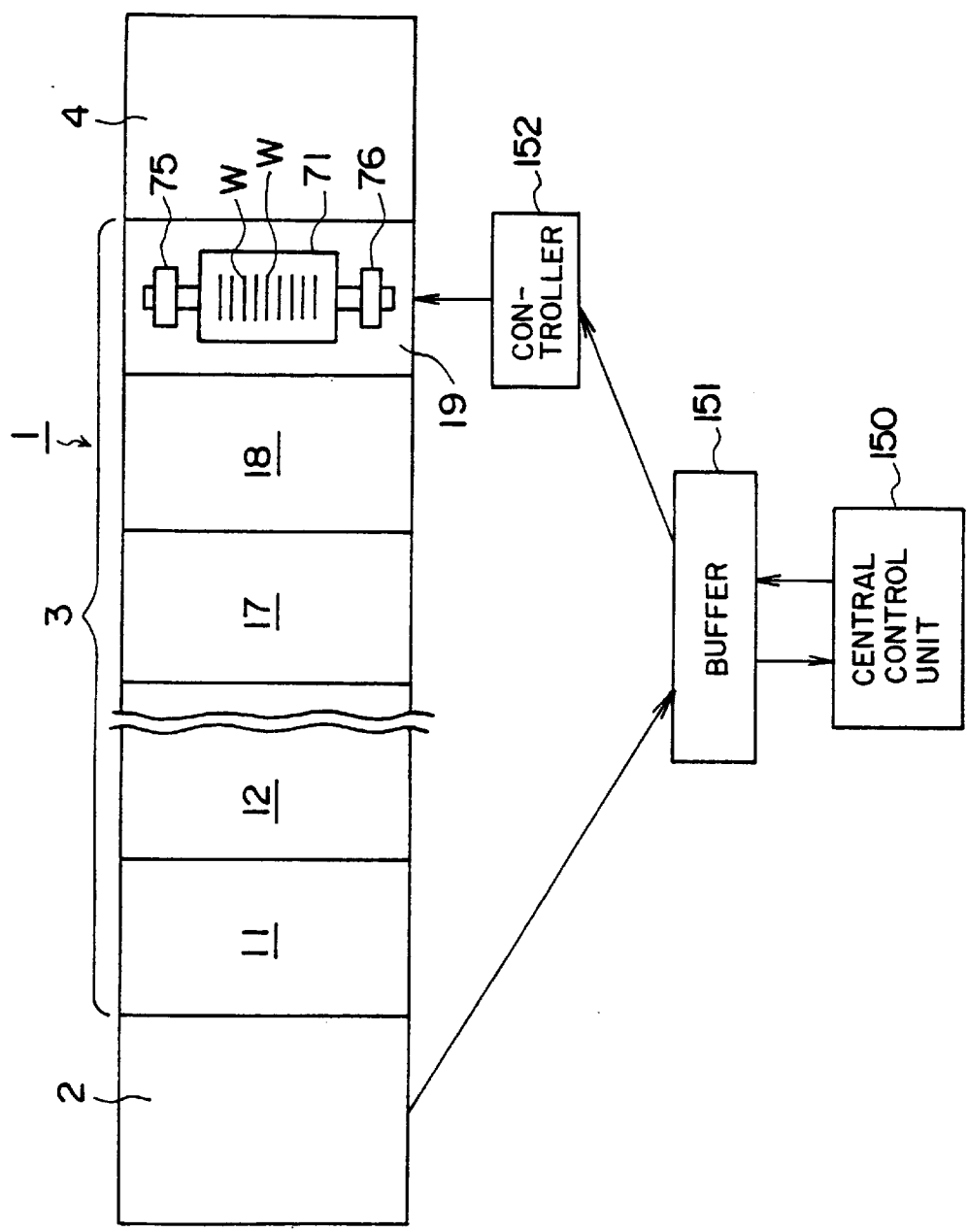
FIG. 11 is a block diagram showing control of the cleaning system.

That is, the number of wafers W counted by the wafer counter 55 at the pick-up part 6 of the loading/pick-up section 2 is inputted and stored in a central control unit 150 through a buffer 151 of FIG. 11. Then, the number stored in the unit 150 is inputted to a controller 152 controlling the autobalancers 75, 76 through the buffer 151 again. Under such a situation, by moving the counterweights in the autobalancers 75, 76, the balance adjustment on the basis of the number of wafers W can be executed.

Figure 12:
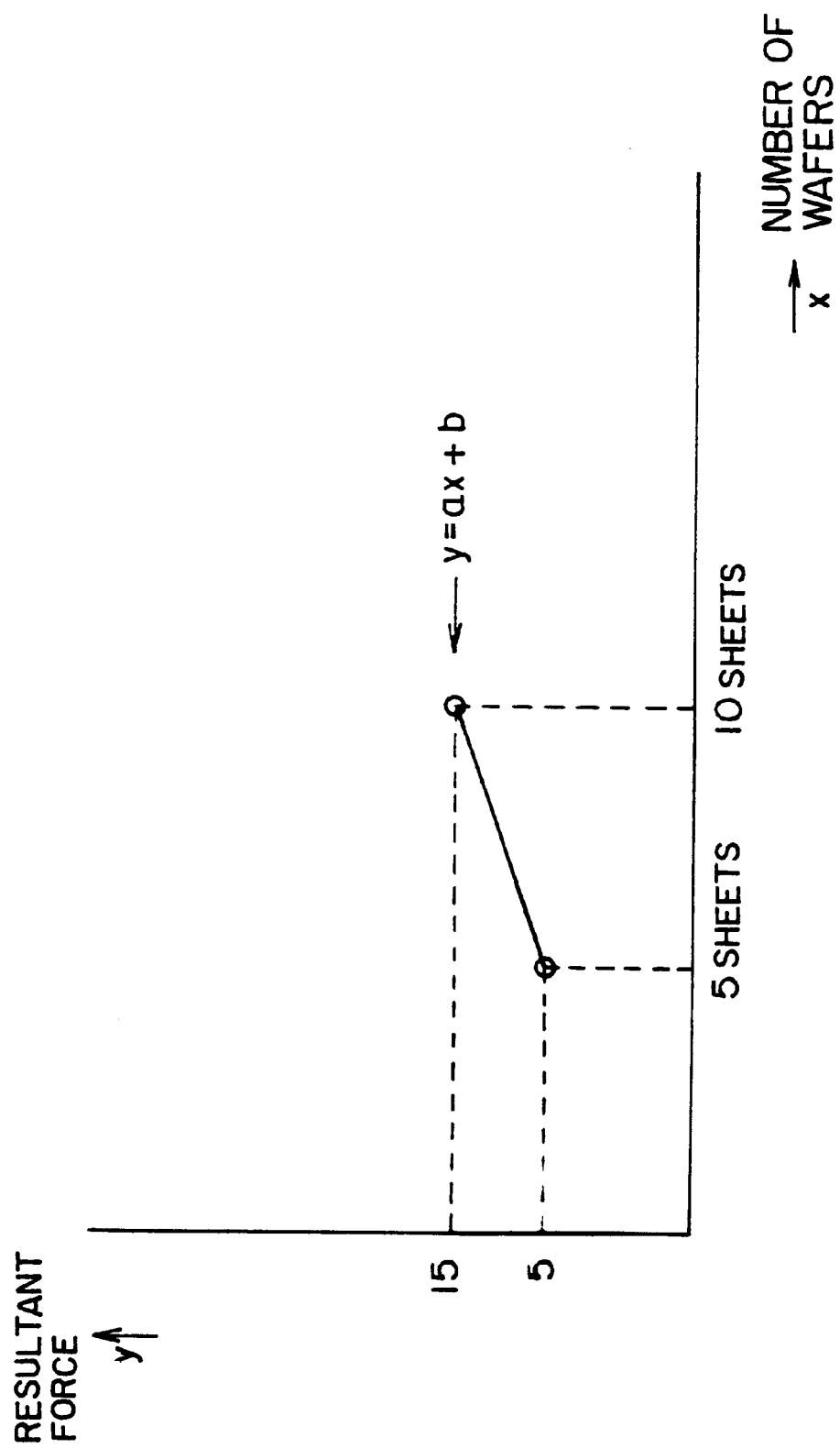
FIG. 12 is a graph showing a relationship between the number x of wafers and the resultant force y of counterweights.

Hereat, respective positions of the counterweights to be moved are memorized as positional data in the controller 152 previously. Accordingly, when the number of wafers W are detected by the wafer counter 55, the positions of the counterweights are selected corresponding to the number of wafers. Note, in order to determine the positions of the counterweights, a relationship as shown in FIG. 12 between the number x of wafers W and the resultant force y of the counterweights is determined in advance by practically accommodating some numbers of wafers W in the chamber 71 to rotate them and sequent moving the counterweights manually or automatically for the balance adjustment. In order to determine the relationship as shown in FIG. 12, the measurement may be applied with respect to the while numbers of wafers W (for example, all numbers containing one to fifty). Alternatively, the measurement may be executed every appropriate numbers (for example, every five sheets of wafers), while a relationship among the respective measurements may be complemented by an approximation (a simple equation). Since the number x (a variable) of wafers W is proportional to the resultant force y (a variable) of counterweights and therefore, it is necessary to increase the resultant force y of counterweights with the increased number x of wafers W, the relationship between x and y can be expressed by a simple equation as follows:

$$y = ax + b$$

wherein "a" is an inclination of this straight line, and "b" is the offset.

For example, as measured data, one resultant force y in case of accommodating five sheets of wafers W and another force y in case of ten wafers W are entered into the relationship (y=ax+b), whereby both of coefficients a (inclination) and b(offset) can be calculated. Then, if six (6) to nine (9) as the number of wafers W are entered into the variable x in the obtained equation, it is possible to calculate the corresponding resultant forces y, respectively.

In the embodiment, the resultant force of counterweights corresponding to the number of wafers are obtained in accordance with the relationship predetermined in the above way and thereafter, the balance adjustment is carried out by selecting the positions of the counterweights. The balance adjustment is completed till the wafers W are accommodated in the chamber 71 at the latest. After accommodating the wafers W in the chamber 71, the wafers W are immediately rotated to start the drying process.

It is noted that in practical, the respective "batch" processes at the loading/pick-up section 2 and the cleaning/drying section 3 and the charging/unloading section 4 are simultaneously executed and therefore, the wafers W corresponding to two carriers C are respectively accommodated in each of the processing parts 12 to 17 of the cleaning/drying section 3 and the rotary processing part 19. Note, a pack of wafers W accommodated in each of the processing parts 12 to 17, 19 will be referred as "a lot", hereinafter. Accordingly, the above-mentioned balance adjustment for the autobalancers 75, 76 has to be executed after the drying process for any lot of wafers W has been finished in the rotary processing part 19 and before the following lot of wafers W are loaded into the processing chamber 71 of the part 19.

Accordingly, in this embodiment, the balance adjustment is conducted in accordance with a program shown in FIG. 13. Thus, at step S1, it is executed to unload a lot of wafers W to which the drying process has been completed in the rotary processing part 19, by means of the wafer chuck 38 of the conveying unit 32. At sequent step S2, the number of wafers W, which are now accommodated in the processing part 17 and which will be accommodated in the processing chamber 71 of the rotary processing part 19 next, is inputted into the controller 152 by the central control unit 150. In this regard, the inputting of the number of wafers W into the controller 152 may be carried out at the deciding a lot of wafers W which will be accommodated in the processing chamber 71 next. Then, the controller 152 operates to decide respective positions of the counterweights in the autobalancer 75, 76 on the basis of the obtained numbers of wafers W and thereafter, the controller 152 outputs a moving command for the counterweights to the autobalancers 75, 76. Consequently, the autobalancers in the autobalancers 75, 76 begin to move, so that the above-mentioned balance adjustment is initiated as shown at step S3.

At step S4, by the central control unit 150, it is executed to calculate a difference X (X=A−B) between time A required for adjusting the balance, i.e. time which is necessary for moving the counterweights in the autobalancers 75, 76, and time B required for completing to accommodate the next lot of wafers W in the processing chamber 71 of the rotary processing part 19, i.e. time from taking out the wafers W from the processing part 17 by the wafer chuck 38 of the conveying unit 32 till finishing to accommodate the wafers W in the processing chamber 71 of the part 19.

At sequent step S5, it is judged whether the time A is equal to or less than the time B or not, i.e. the difference X is zero or a negative value. If the judgement at step S5 is Yes (i.e. $X \leq 0$), it means that when the process to accommodate the wafers W in the chamber 19 is completed, the adjustment for the balance of the autobalancers 75, 76 has been always finished. Therefore, in such a case, the routine goes to step S7 where a process to transporting the wafers W from the processing part 17 is executed as soon as the balance adjustment is started.

On the contrary, if the time A is longer than the time B (X>0), there is a possibility of situation that if the transporting of wafers W is started as soon as the operation of balance adjustment is started, the adjustment operation is not finished yet when the wafers W are accommodated in the processing chamber 71 of the part 19. In such a case, many water marks may appear on the surfaces of the wafers W disadvantageously, since it is impossible to start to rotate the wafers W instantly.

Therefore, when the time A is longer than the time B (X>0), then the routine goes to step S6. At step S6, it is executed to hold the starting of operation of the conveying unit 32 in readiness for the time X since the above balance adjusting operation has been started in the autobalancers 75, 76. In this way, after the time X has passed, the wafers W are taken out from the processing part 17 by the wafer chuck 38 of the conveying unit 32 and accommodated in the processing chamber 71 of the rotary processing part 19. With the above "stand-by" process, it is possible to realize the situation that the adjustment for the balance of the autobalancers 75, 76 has been always finished when the process to accommodate the wafers W in the chamber 19 is completed.

When the processes to restrict the wafers W between the lower and upper constraint mechanisms 102, 103 in the processing chamber 71 of the part 19 collectively and sequent accommodate the wafers W by closing the chamber 71 with the lid body 81 are completed in this way, then the routine goes to step S8 where the motor 71 is immediately energized for rotation. Consequently, with the rotation of the wafers W, the water sticking on the surfaces is spattered around due to the centrifugal force. Then, since the balance adjustment has been already finished, it is possible to reduce the vibrations caused by the rotation of wafers W.

Simultaneously, the gas-liquid removing mechanism 140 in the frame 70 is operated to start. In detail, the inside pressure in the processing chamber 71 is reduced by an operation of the blower 142, so that fresh air cleaned through a not-shown filter enters into the chamber 71. Since the fresh air is blown against the surfaces of the wafers W rotating in the chamber 71, they are dried in consequence. The water removed from the surfaces is drained to the underside of the chamber 71 together with the supply air from the blower 142 and thereafter, the only water is trapped by the drain 141.

With the completion of process for drying the wafers W, the routine goes to step S9 where the motor 74 is inactivated to stop the rotation of wafers W. Next, the upper constraint mechanism 103 is turned upward by ninety angles (90°) into so-called "turnout" condition, while the lid body 81 is rotated to take a shelter, whereby the chamber 71 opens upward. Then, the wafer chuck 38 of the conveying unit 32, which has been previously cleaned and dried in the processing part 18, descends into the chamber 71 to pick up the cleaned and dried wafers W therefrom. After picking up, the conveying unit 32 carries the wafers W to the charging part 20 of the charging/unloading section 4. After completing the above-mentioned processes in this way, the wafers W are charged into the carrier C at the charging part 20 of the section 4 and sequentially unloaded to the outside of the cleaning system 1 at the unloading part 21.

According to the shown embodiment of the present invention, which has been described on the basis of the cleaning system 1 for cleaning the wafers W, since the objects to be processed are no sooner accommodated into the rotary processing part than the operation of the motor 74 is started, the water sticking on the surfaces of the wafers W scatters immediately before the water is evaporated naturally due to the centrifugal force applied on the objects. Accordingly, there is no fear of leaving water marks on the surfaces of the wafers W.

As mentioned above, according to the present invention, owing to the instant starting to rotate the objects to be processed after accommodating them into the rotary processing part, it is possible to shorten time for processing. In addition, since a period from the completion to accommodate the objects till the starting to rotate them is remarkably short, it is possible to avoid the occurrence of troubles on the objects during the same period.

Finally, it will be understood by those skilled in the art that the foregoing description is one of the preferred embodiments of the processing apparatus and processing method, and that various changes and modifications may be made to the present invention without departing from the spirit and scope thereof.

What is claimed is:

1. A processing apparatus comprising:
a rotary processing part for rotating and drying plural sheets of objects to be processed collectively;
a balance adjusting mechanism having at least one counterweight for adjusting the balance of said rotary processing part by moving said at least one counterweight in accordance with the number of said objects;
counting means for counting the number of said objects accommodated in said rotary processing part; and
control means for controlling the balance adjusting operation by said balance adjusting mechanism in accordance with a predetermined relationship between the number of said objects and respective positions of said at least one counterweight, wherein
said control means controls said balance adjusting mechanism in a manner so that the balance adjusting operation of said balance adjusting mechanism is finished by the time said objects are accommodated in said rotary processing part, wherein
a period provided from a beginning of the balance adjusting operation to the end is represented by a letter A, while a period from a beginning of transferring said object from a former processing part just before said rotary processing part, to said rotary processing part to the end of transferring, after which said objects are able to be rotary-processed, is represented by a letter B, and wherein
said control means is constructed so that, in case of $A \leq B$, the transferring of said objects into said rotary processing part is started as soon as the balance adjusting operation has been started, while in case of $A > B$, the objects wait for at least a time A B since the balance adjusting operation was started, at the former processing part just before said rotary processing part, then the transferring of said objects into said rotary processing part is started.

2. A processing apparatus comprising:
one or more processing parts for processing plural sheets of objects to be processed;
a rotary processing part for collectively rotating and drying said objects processed by said processing parts;
a balance adjusting mechanism having at least one counterweight for adjusting the balance of said rotary processing part by moving said at least one counterweight in accordance with the number of said objects;
counting means for counting the number of said objects before said objects are processed by said processing parts; and
control means for controlling the balance adjusting operation by said balance adjusting mechanism in accordance with a predetermined relationship between the number of said objects and respective positions of said at least one counterweight, wherein
said control means controls said balance adjusting mechanism in a manner so that the balance adjusting operation of said balance adjusting mechanism is finished by the time said objects are accommodated in said rotary processing part, wherein
a period provided from a beginning of the balance adjusting operation to the end is represented by a letter A, while a period from a beginning of transferring said object from a former processing part just before said rotary processing part, to said rotary processing part to the end of transferring, after which said objects are able to be rotary-processed, is represented by a letter B, and wherein
said control means is constructed so that, in case of $A \leq B$, the transferring of said objects into said rotary processing part is started as soon as the balance adjusting operation has been started, while in case of $A > B$, the objects wait for at least a time AB since the balance adjusting operation was started, at the former processing part just before said rotary processing part, then the transferring of said objects into said rotary processing part is started.

3. A processing apparatus comprising:
a rotary processing part for rotating and drying plural sheets of objects to be processed collectively;
a balance adjusting mechanism having at least one counterweight for adjusting the balance of said rotary processing part by moving said at least one counterweight in accordance with the number of said objects;

counting means for counting the number of said objects accommodated in said rotary processing part; and control means for controlling the balance adjusting operation by said balance adjusting mechanism in accordance with a predetermined relationship between the number of said objects and respective positions of said at least one counterweight, wherein said control means controls said balance adjusting mechanism in a manner so that the balance adjusting operation of said balance adjusting mechanism is finished by the time said objects are accommodated in said rotary processing part, and wherein said predetermined relationship between the number of said objects and the position of said at least one counterweight is introduced from a predetermined relationship between the number of said objects and resultant force of said at least one counterweight, and wherein, providing that the number of said objects is represented by a variable x while the resultant force is represented by a variable y, and certain constant values are represented by constants a and b, said predetermined relationship between the number of said objects and the resultant force is expressed by an equation as below:

$y=ax+b.$

4. A processing apparatus comprising:

one or more processing parts for processing plural sheets of objects to be processed;

a rotary processing part for collectively rotating and drying said objects processed by said processing parts;

a balance adjusting mechanism having at least one counterweight for adjusting the balance of said rotary processing part by moving said at least one counterweight in accordance with the number of said objects;

counting means for counting the number of said objects before said objects are processed by said processing parts; and control means for controlling the balance adjusting operation by said balance adjusting mechanism in accordance with a predetermined relationship between the number of said objects and respective positions of said at least one counterweight, wherein said control means controls said balance adjusting mechanism in a manner so that the balance adjusting operation of said balance adjusting mechanism is finished by the time said objects are accommodated in said rotary processing part, and wherein said predetermined relationship between the number of said objects and the position of said at least one counterweight is introduced from a predetermined relationship between the number of said objects and resultant force of said at least one counterweight, and wherein, providing that the number of said objects is represented by a variable x while the resultant force is represented by a variable y, and certain constant values are represented by constants a and b, said predetermined relationship between the number of said objects and the resultant force is expressed by an equation as below:

$y=ax+b.$

5. A processing apparatus comprising:

one or more processing parts for processing plural sheets of objects to be processed;

a rotary processing part for collectively rotating and drying said objects processed by said processing parts;

counting means located outside of said rotary processing part for counting the number of said objects before said objects are processed by said processing parts;

a balance adjusting mechanism having at least one counterweight for adjusting the balance of said rotary processing part, by moving said at least one counterweight in accordance with the number of said objects; and control means for memorizing the number of said objects counted by said counting means and controlling the balance adjusting operation by moving said balance adjusting mechanism in accordance with a predetermined relationship between the number of said objects and respective positions of said at least one counterweight.

6. A processing apparatus comprising:

a rotary processing part for rotating and drying plural sheets of objects to be processed collectively;

counting means located outside of said rotary processing part for counting the number of said objects;

a balance adjusting mechanism having at least one counterweight for adjusting the balance of said rotary processing part by moving said counterweights in accordance with the number of said objects counted by said counting means; and control means for controlling the balance adjusting operation by said balance adjusting mechanism in accordance with a predetermined relationship between the number of said objects and respective positions of said at least one counterweight, wherein said control means controls said balance adjusting mechanism in a manner that the balance adjusting operation of said balance adjusting mechanism has been finished by the time said objects are accommodated in said rotary processing part.

7. A processing apparatus comprising:

one or more processing parts for processing plural sheets of objects to be processed;

a rotary processing part for collectively rotating and drying said objects processed by said processing parts;

counting means located in the outside of said rotary processing part for counting the number of said objects before said objects are processed by said processing parts;

a balance adjusting mechanism having at least one counterweight for adjusting the balance of said rotary processing part, by moving said at least one counterweight in accordance with the number of said objects; and control means for memorizing the number of said objects counted by said counting means and controlling the balance adjusting operation by moving said balance adjusting mechanism in accordance with a predetermined relationship between the number of said objects and respective positions of said at least one counterweight, wherein said control means controls said balance adjusting mechanism in a manner that the balance adjusting operation of said balance adjusting mechanism has been finished by the time said objects are accommodated in said rotary processing part.

* * * * *